US 6,587,982 B1

(12) United States Patent
Lee et al.

(10) Patent No.: US 6,587,982 B1
(45) Date of Patent: Jul. 1, 2003

(54) METHOD OF MICRO-ARCHITECTURAL IMPLEMENTATION OF INTERFACE BETWEEN BIST STATE MACHINE AND TESTER INTERFACE TO ENABLE BIST CYCLING

(75) Inventors: Weng F. Lee, Penang (MY); Colin S. Bill, Cupertino, CA (US); Feng Pan, San Jose, CA (US); Edward V. Bautista, Santa Clara, CA (US); Azrul Halim, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 448 days.

(21) Appl. No.: 09/654,965

(22) Filed: Sep. 5, 2000

(51) Int. Cl.⁷ .............................................. G01R 31/28
(52) U.S. Cl. ...................................................... 714/733
(58) Field of Search .................................... 714/733, 30

(56) References Cited

U.S. PATENT DOCUMENTS

| 5,668,815 A | * | 9/1997 | Gittinger et al. ............ 714/719 |
| 5,872,793 A | * | 2/1999 | Attaway et al. ............ 714/726 |
| 6,044,481 A | * | 3/2000 | Kornachuk et al. ......... 714/724 |

* cited by examiner

Primary Examiner—Albert Decady
Assistant Examiner—Shelly A Chase
(74) Attorney, Agent, or Firm—Davis Chin

(57) ABSTRACT

There is provided a tester interface circuit for use with a BIST state machine and a method for micro-architectural implementation of the same so as to enable cycling through a BIST test. The tester interface circuit includes a storage device, a logic decoder, a set/clear mechanism, and a polling logic device. The tester interface circuit is implemented with a minimum amount of chip area on a semiconductor IC.

6 Claims, 5 Drawing Sheets

Fig. 4c
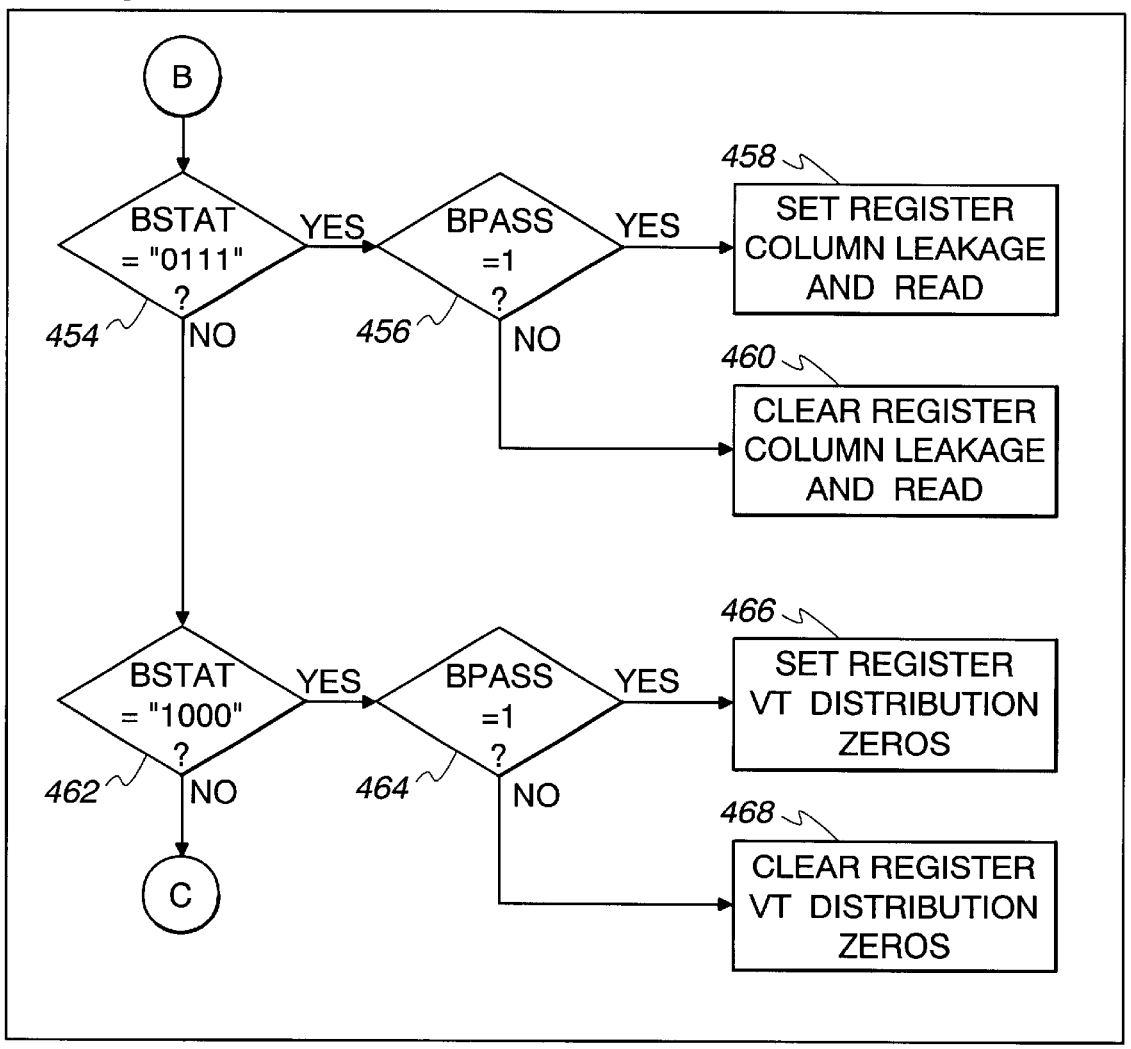
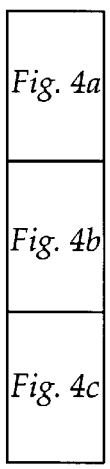
Fig. 4

METHOD OF MICRO-ARCHITECTURAL IMPLEMENTATION OF INTERFACE BETWEEN BIST STATE MACHINE AND TESTER INTERFACE TO ENABLE BIST CYCLING

BACKGROUND OF THE INVENTION

This invention relates generally to advanced flash IC (integrated circuit) chips which includes a state machine for performing built-in self-test functions. More particularly, the present invention relates to a tester interface circuit for use with a BIST state machine and a method for micro-architectural implementation of the same so as to enable cycling through the BIST tests.

As is generally well-known, flash IC chips have become widely used in almost all forms of electronic devices such as cell-phones, digital camera, computers, PDA and many others. As flash memory IC chips are being used more and more, there has been a growing trend of requiring increased demands from flash designers in many characteristics of the flash manufacturing processes, such as reliability.

For example, since these flash IC chips are quite complex in nature, flash chips manufacturers have to manually test these chips before they are being shipped to customers. This process of manual testing is tedious and requires much effort. Not to mention the high cost involved. With this in mind, flash chips manufacturers have implemented a method of built-in self-test circuitry on the flash memory IC chip so as to perform internal hardware tests on the various types of integrated circuits associated with the flash chip before they are shipped to the customers. This built-in self-test would make all the necessary tests on its own with only a minimal external hardware and minimal manual supervision. This capability of having built-in self-test circuitry eliminates the need of expensive hardware testers which greatly increases the overall manufacturing cost.

In our co-pending application Ser. No. 09/655,335 filed on Sep. 5, 2000 and entitled "Method of Micro-Architectural Implementation on BIST Frontend state Machine Utilizing 'Death Logic' State Transition for Area Minimization", there is illustrated and described a BIST state machine that can be used to perform the BIST test automatically. This Ser. No. 09/655,335 is assigned to the same assignee as the present invention and is hereby incorporated by reference in its entirety. The tester interface circuit of the instant invention can be used to interface with such BIST state machine so as to perform the BIST tests automatically.

In order to perform the BIST tests automatically, there is required a tester interface circuit which can accept the necessary protocols being loaded in by a user, such as a test engineer. Upon identifying the necessary protocols, the BIST state machine is caused to cycle through the required BIST tests dependent upon the data being loaded into the tester interface circuit through the BIST protocols. Therefore, it would be desirable to a tester interface circuit which is closely linked to the BIST state machine so as to operate on an effective and efficient basis. Further, it would be expedient to implement the tester interface circuit with a minimum amount of chip area on a semiconductor IC.

SUMMARY OF THE INVENTION

Accordingly, it is a general object of the present invention to provide a tester interface circuit for use with a BIST state machine and a method for micro-architectural implementation of the same so as to enable cycling through the BIST tests.

It is another object of the present invention to provide a tester interface circuit for use with a BIST state machine which is achieved with a minimal amount of chip area on a semiconductor IC.

It is another object of the present invention to provide a tester interface circuit which is closely linked to the BIST state machine so as to operate on an effective and efficient basis.

It is still another object of the present invention to provide a tester interface circuit for use with a BIST state machine which includes a logic decoder for determining which particular register in a shift register is to be set or cleared in response to status signals from the BIST state machine.

In a preferred embodiment of the present invention, there is provided a tester interface circuit for use with a BIST state machine so as to enable cycling through a BIST test. The tester interface circuit includes a storage device, a logic decoder, a set/clear mechanism, and polling logic device. The storage device stores data that is inputted by a user and generates output register signals corresponding to which tests are to be executed by the BIST state machine. The logic decoder is responsive to status signals from the BIST state machine for determining which particular register in a shift register is to be set or cleared.

The set/clear mechanism is responsive to a completed signal indicating that a particular test has been completed, a failed signal indicating that a particular test has failed, and a pass signal indicating that a particular is to be bypassed for generating a set/clear signal. The shift register is formed of a plurality of registers and is responsive to the logic decoder and the set/clear signal for storing the result of the test currently being executed. The polling logic device is responsive to a busy signal for indicating that a test is currently being executed and that the BIST state machine is busy.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 4(a), 4(b) and 4(c), when connected together, is a flow chart of the decoding logic block and the Set/clear for pass/fail block in FIG. 2.

DESCRIPTION OF THE PREFERRED EMBODIMENT

As previously pointed out, flash IC chips manufacturers test the flash memory IC chips manually, which is tedious, time consuming and very costly. With this invention, it provides a tester interface circuit for use with the BIST state machine within the flash chip so as to perform various types of tests before shipment to a consumer, thereby resulting in a higher reliability and very low cost, since the tester interface circuit allows for testing with only minimal external hardware and minimal manual intervention. The testing on the whole is sometimes referred to as built-in self-test (BIST). At times, the testing process is performed by a state machine under the control of a processor via an interface bus. The purpose of this invention is to provide a tester interface circuit which is closely linked to the BIST state machine so as to operate efficiently therewith, but is achieved with a minimal amount of chip area on a semiconductor IC.

Figure 1:
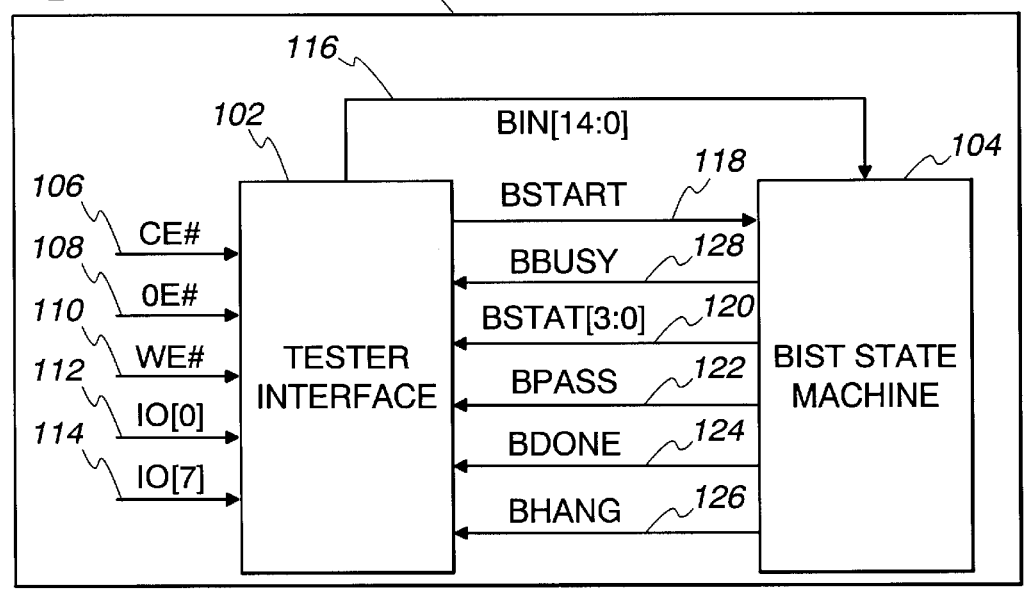
FIG. 1 is a general block diagram, illustrating interface signals between a tester interface circuit of the present invention and a BIST state machine.

Referring now to FIG. 1 of the drawings, there is shown a general block diagram 100 which illustrates the interface signals between a tester interface circuit 102 of the present invention and a BIST state machine 104. The tester interface circuit 102 receives command input signals CE on line 106, OE on line 108, WE on line 110, IO(0) on line 112, and IO(7) on line 114.

The tester interface circuit 102 generates output register signals BIN(14:0) on a 15-bit test bus 116 to the BIST state machine 104. The values of the register signals BIN(14:0) represent information on which tests should be executed by the state machine 104. The BSTART signal on line 118 is an activation signal which is sent to the state machine 104 in order to start the same. The tester interface circuit 102 further receives as an input the BSTAT (3:0) status signals on a 4-bit bus 120 from the state machine. The values of the status registers BSTAT (3:0) contain encoded information to "inform" the tester interface circuit 102 as to which test is currently being executed. The status signals are decoded by the tester interface circuit 102 in order to determine which corresponding register should be set/cleared dependent upon the value of an input signal BPASS on line 122.

Further, the tester interface circuitry receives an input signal BDONE on line 124 which "informs" it that the current test has been completed successfully. The tester interface circuit also receives an input signal BHANG on line 126 which "informs" it that the current test has failed. Finally, an input signal BBUSY on line 128 is inputted to the tester interface circuit which "informs" it that a test is currently being executed and that the state machine is busy.

Figure 2:
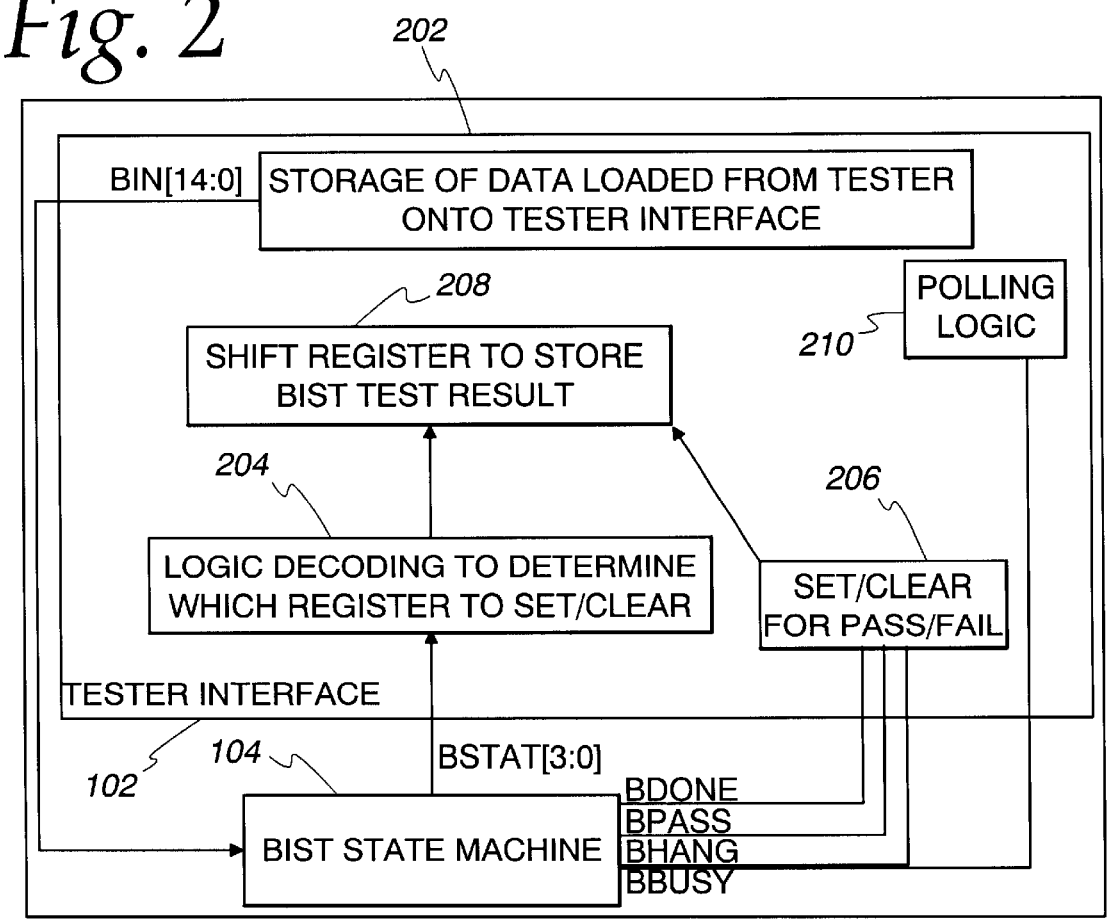
FIG. 2 is a more detailed block diagram of the tester interface circuit of FIG. 1, constructed in accordance with the principles of the present invention.

In FIG. 2, there is shown a more detailed block diagram of the tester interface circuit 102 in FIG. 1 which is coupled to the state machine 104. As can be seen, the tester interface circuit 102 is comprised of a memory or storage device 202, a logic decoder 204, a set/clear mechanism 206, a shift register 208, and a polling logic device 210.

The memory device 202 is used for storing data corresponding to the tests to be executed by the state machine which tests are loaded therein by a user, such as a test engineer. The logic decoder 204 is responsive to the BSTAT (3:0) status signals for determining which register of the shift register 208 is to be set or cleared. A particular register corresponding to a test to be executed will be either set or cleared in the shift register 208 so as to indicate a successfully completed test or a failed test, respectively. The set/clear mechanism 206 determines whether the particular register will be set or cleared in response to the signals BDONE, BHANG, and BPASS from the state machine 104. The polling logic device 210 is used to determine whether the particular test currently being executed is completed or not.

Figure 3:
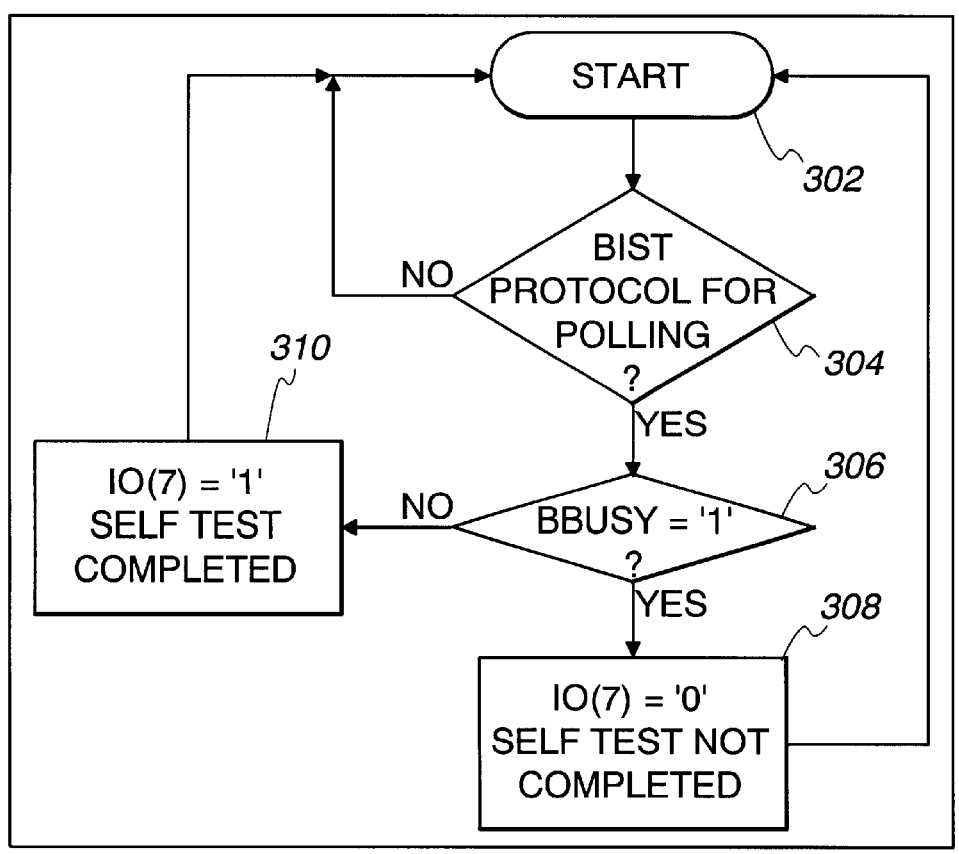
FIG. 3 is a flow chart of the polling logic block in FIG. 2.

FIG. 3 shows a flow chart 300 for implementing the polling logic device 210 of FIG. 2. The polling process begins at a Start block 302 and moves to a polling block 304. If a polling signal is high in the block 304, the process will move to a decision block 306 to determine whether the signal BBUSY is at a logic "1". If the polling signal is low in the block 304, then the process is returned to the Start block 302 waits for another polling signal which is high. If the answer is "YES" in the decision block 306, the process moves to a block 308 to drive the signal IO(7)=0 which indicates that the test being executed is not completed and is then returned to the Start block 302. If the answer is "NO' in the decision block 306, the process moves to a block 310 to drive the signal IO(7)=1 which indicates that the test being executed has been completed and is then returned to the Start block 302.

Figure 4A:
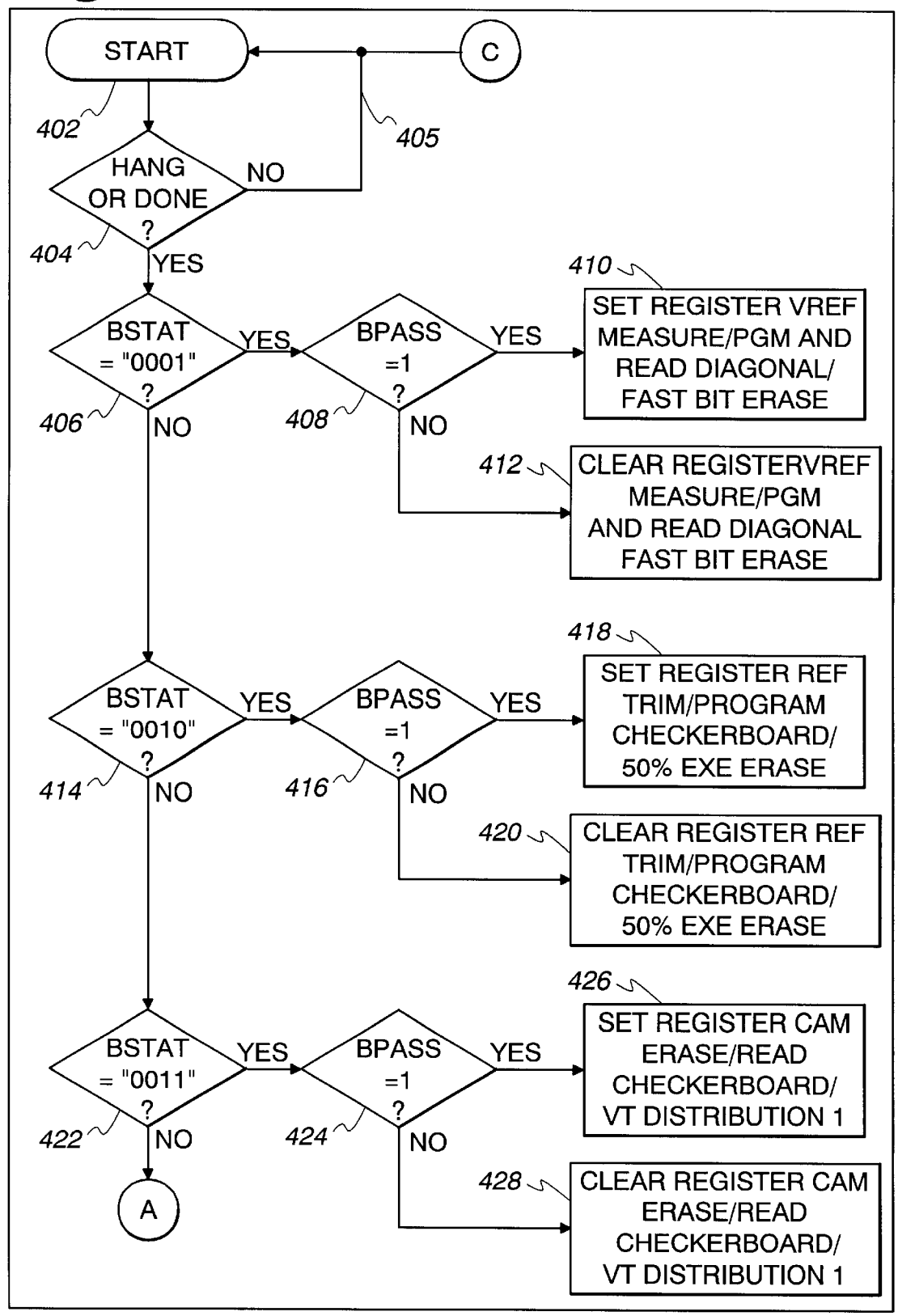
Figure 4B:
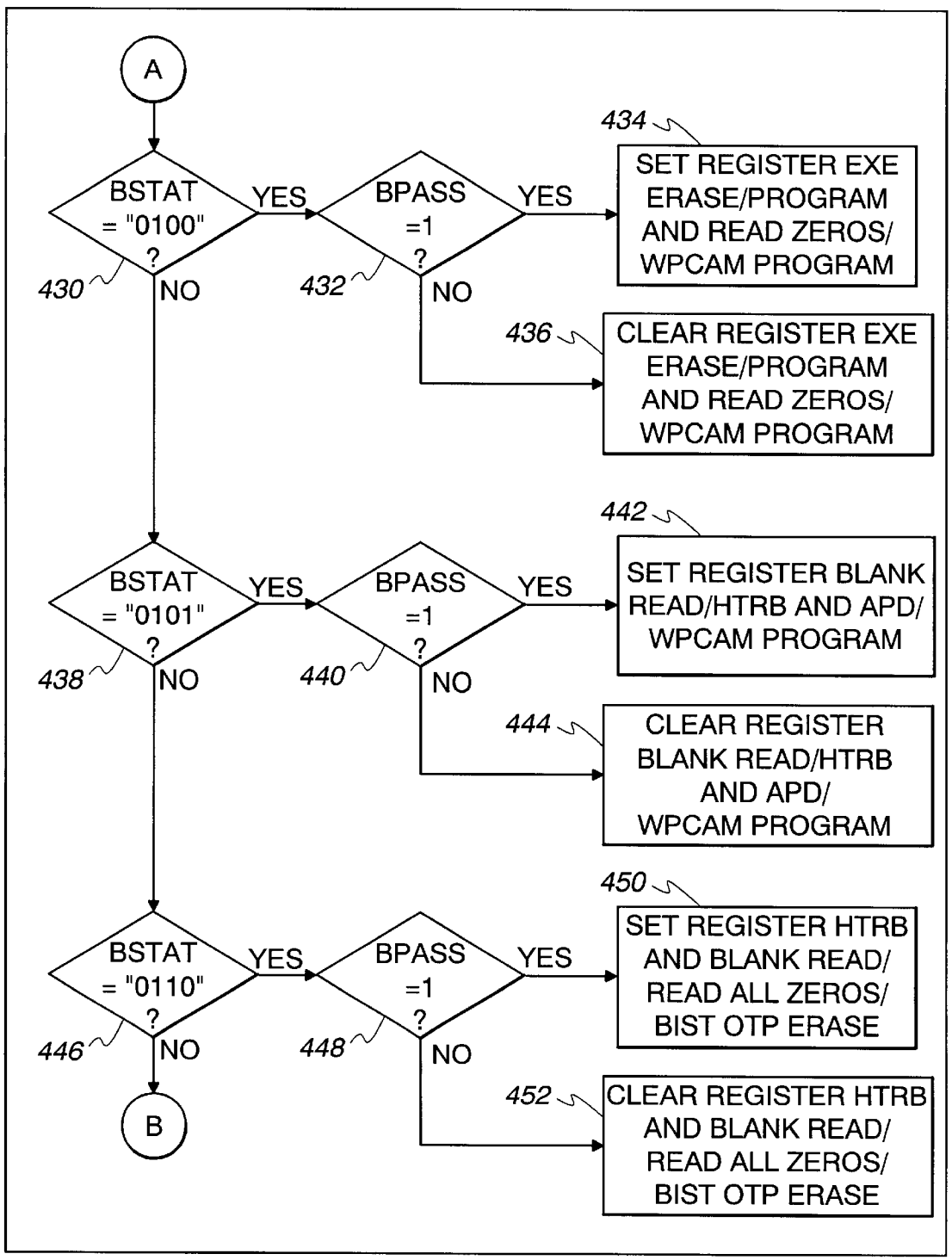

In FIGS. 4(a), 4(b) and 4(c), when connected together, there is shown a flow chart 400 of the logic decoder 204 and Set/clear for pass/fail logic of block 206 of FIG. 2. As can be seen in FIG. 4(a), there is depicted a START block 402 which is followed by a HANG/DONE decision block 404 where it is determined if the signal BHANG is equal to a "1" or if the signal BDONE is equal to a "1". If neither the signal BHANG or BDONE is equal to a "1", then the process proceeds to a first status decision block 406 in order to determine if a first test represented by BSTAT=0001 is to be executed. If either the signal BHANG or BDONE is at a "1" in the decision block 404, then the process is returned to the START block 402 via line 405.

In the first status decision block 406, if the answer is "YES" then the process branches to a pass/fail decision block 408 to determine if the signal BPASS is equal to a "1" or not. If the signal BPASS is equal to a "1" indicating a successful or "passed" test, then a first register used to store the result of the first test is set in the block 410. If the signal BPASS is equal to "0" indicating a "failed" test, then the first register is cleared in the block 412. On the other hand, if the answer is "NO" in the first status decision block 406, then the process proceeds to a second status decision block 414 to determine if a second test represented by BSTAT=0010 is to be executed.

In the second status decision block 414, if the answer is "YES" then the process branches to a pass/fail decision block 416 to determine if the signal BPASS is equal to a "1" or not. If the signal BPASS is equal to a "1" indicating a successful or "passed" test, then a second register used to store the result of the second test is set in the block 418. If the signal BPASS is equal to "0" indicating a "failed" test, then the second register is cleared in the block 420. On the other hand, if the answer is "NO" in the second status decision block 414, then the process proceeds to a third status decision block 422 to determine if a third test represented by BSTAT=0011 is to be executed.

In the third status decision block 422, if the answer is "YES" then the process branches to a pass/fail decision block 424 to determine if the signal BPASS is equal to a "1" or not. If the signal BPASS is equal to a "1", indicating a successful or "passed" test, then a third register used to store the result of the third test is set in the block 426. If the signal BPASS is equal to "0" indicating a "failed" test, then the third register is cleared in the block 428. On the other hand, if the answer is "NO" in the third status decision block 422, then the process proceeds to a fourth status decision block 430 via connector A in FIG. 4(b) to determine if a fourth test represented by BSTAT=0100 is to be executed.

Continuing in the flow chart of FIG. 4(b), in the fourth status decision block 430, if the answer is "YES" then the process branches to a pass/fail decision block 432 to determine if the signal BPASS is equal to a "1" or not. If the signal BPASS is equal to a "1" indicating a successful or "passed" test, then a fourth register used to store the result of the fourth test is set in the block 434. If the signal BPASS is equal to "0" indicating a "failed" test, then the fourth register is cleared in the block 436. On the other hand, if the answer is "NO" in the fourth status decision block 430, then the process proceeds to a fifth status decision block 438 to determine if a fifth test represented by BSTAT=0101 is to be executed.

In the fifth status decision block 438, if the answer is "YES" then the process branches to a pass/fail decision block 440 to determine if the signal BPASS is equal to a "1" or not. If the signal BPASS is equal to a "1" indicating a successful or "passed" test, then a fifth register used to store the result of the fifth test is set in the block 442. If the signal BPASS is equal to "0" indicating a "failed" test, then the fifth register is cleared in the block 444. On the other hand, if the answer is "NO" in the fifth status decision block 438, then the process proceeds to a sixth status decision block 446 to determine if a sixth test represented by BSTAT=0110 is to be executed.

In the sixth status decision block 446, if the answer is "YES" then the process branches to a pass/fail decision block 448 to determine if the signal BPASS is equal to a "1" or not. If the signal BPASS is equal to a "1" indicating a successful or "passed" test, then a sixth register used to store the result of the sixth test is set in the block 450. If the signal BPASS is equal to "0" indicating a "failed" test, then the sixth register is cleared in the block 452. On the other hand, if the answer is "NO" in the sixth status decision block 446, then the process proceeds to a seventh status decision block 454 via connector B to FIG. 4(*c*) to determine if a seventh test represented by BSTAT=0111 is to be executed.

In the seventh status decision block 454, if the answer is "YES" then the process branches to a pass/fail decision block 456 to determine if the signal BPASS is equal to a "1" or not. If the signal BPASS is equal to a "1" indicating a successful or "passed" test, then a seventh register used to store the result of the seventh test is set in the block 458. If the signal BPASS is equal to "0" indicating a "failed" test, then the seventh register is cleared in the block 460. On the other hand, if the answer is "NO" in the seventh status decision block 454, then the process proceeds to an eighth status decision block 462 to determine if an eighth test represented by BSTAT=1000 is to be executed.

In the eighth status decision block 462, if the answer is "YES" then the process branches to a pass/fail decision block 464 to determine if the signal BPASS is equal to a "1" or not. If the signal BPASS is equal to a "1" indicating a successful or "passed" test, then an eighth register used to store the result of the eighth test is set in the block 466. If the signal BPASS is equal to "0" indicating a "failed" test, then the eighth register is cleared in the block 468. On the other hand, if the answer is "NO" in the eighth status decision block 462, then the process is returned to the START block 402 via connector C since this is the last status block to be checked.

It should be clearly understood that in order to store the test results for the BIST SORT SET1, or BIST SORT SET2, or BIST SORT SET3 described in the aforementioned Ser. No. 09/655,335 the first register corresponds to either the "Vref Measure", or "Program and Read Diagonal", or "Fast Bit" register, respectively. The second register corresponds to either the "Reference Trim", or "Program Checkerboard", or "50% EXE" register, respectively. The third register corresponds to either the "Reference CAM Erase", or "Read Checkerboard", or VT Distribution One" register, respectively.

Further, the fourth register corresponds to either the "EXE Erase", or "Program and Read Zeros", or "WPCAM Program" register, respectively. The fifth register corresponds to either the "Blank Read", or "HTRB and APD", or "WPCAM Erase," register, respectively. The sixth register corresponds to either the "HTRB and Blank Read", or "Read All Zeros", or "BIST OTP Erase" register, respectively. Since there are only six tests for the BIST SORT SET1 and BIST SORT SET3, the seventh register corresponds to the "Column Leakage and Read" register and the eighth register corresponds to the VT Distribution Zeros" register for the BIST SORT SET2.

From the foregoing detailed description, it can thus be seen that the present invention provides a tester interface circuit for use with a BIST state machine and a method for micro-architectural implementation of the same so as to enable cycling through the BIST tests. The tester interface circuit is closely linked to the BIST state machine so as to operate effectively and is implemented with a minimum amount of chip area on a semiconductor IC.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A tester interface circuit for use with a BIST state machine so as to enable cycling through a BIST test comprising:

memory means for storing data inputted by a user and for generating output register signals corresponding to which tests are to be executed by the BIST state machine;

logic decoding means responsive to status signals from the BIST state machine for determining which particular register in a shift register is to be set or cleared;

a set/clear mechanism responsive to a completed signal indicating that a particular has been completed, a failed signal indicating that a particular test has failed, and a pass signal indicating that a particular test is to be bypassed for generating a set/clear signal;

said shift register formed of a plurality of registers and being responsive to said logic decoding means and said set/clear signal for storing the results of the test currently being executed; and polling logic means responsive to a busy signal for indicating that a test is currently being executed and that the BIST state machine is busy.

2. A tester interface circuit as claimed in claim 1, wherein each register of said shift register corresponds to a particular test to be executed.

3. A tester interface circuit as claimed in claim 2, wherein each register of said shift register is set by said logic decoding means if the particular test being executed is completed successfully or is cleared if the particular test has failed.

4. A method for a tester interface circuit used with a BIST state machine so as to enable cycling through a BIST test comprising the steps of:

storing data inputted by a user so as to generate output register signals corresponding to which tests are to be executed by the BIST state machine;

decoding status signals from the BIST state machine so as to determine which particular register in a shift register is to be set or cleared;

generating a set/clear signal in response to a completed signal indicating that a particular has been completed, a failed signal indicating that a particular test has failed, and a pass signal, indicating that a particular test is to be bypassed;

storing the result of the test currently being executed in the shift register formed of a plurality of registers in response to the status signals and the set/clear signal; and providing polling logic in response to a busy signal for indicating that a test is currently being executed and that the BIST state machine is busy.

5. A method for a tester interface circuit as claimed in claim 4, wherein each register of said shift register corresponds to a particular test to be executed.

6. A method for a tester interface circuit as claimed in claim 5, further including the step of setting a particular register of said shift register if the particular test being executed is completed successfully or the step of clearing the particular register of said shift register if the particular test has failed.

* * * * *